United States Patent
Matsubara et al.

(10) Patent No.: US 8,437,425 B2
(45) Date of Patent: May 7, 2013

(54) DISTORTION COMPENSATION DEVICE, DISTORTION COMPENSATION METHOD AND WIRELESS APPARATUS

(75) Inventors: Satoshi Matsubara, Kawasaki (JP); Takeshi Ohba, Kawasaki (JP); Hideharu Shako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 49 days.

(21) Appl. No.: 13/289,210

(22) Filed: Nov. 4, 2011

(65) Prior Publication Data

US 2012/0147991 A1 Jun. 14, 2012

(30) Foreign Application Priority Data

Dec. 13, 2010 (JP) ................................. 2010-277487

(51) Int. Cl.
*H04K 1/02* (2006.01)
*H04L 25/03* (2006.01)
*H04L 25/49* (2006.01)

(52) U.S. Cl.
USPC ........... 375/297; 375/284; 375/285; 375/295; 375/296

(58) Field of Classification Search ................. 375/284, 375/285, 295, 296, 297
See application file for complete search history.

(56) References Cited

U.S. PATENT DOCUMENTS

| 6,091,941 | A  | * | 7/2000 | Moriyama et al. ............ 455/126 |
| 6,836,517 | B2 | * | 12/2004 | Nagatani et al. ............. 375/296 |
| 7,388,926 | B2 |   | 6/2008 | Ishikawa et al. |
| 7,433,421 | B2 |   | 10/2008 | Shako et al. |
| 7,639,755 | B2 |   | 12/2009 | Ishikawa et al. |
| 2001/0005402 | A1 | * | 6/2001 | Nagatani et al. ............. 375/296 |

FOREIGN PATENT DOCUMENTS

| JP | 2001-189685 A | 7/2001 |
| JP | 2004-187218 A | 7/2004 |
| JP | 2005-311710 A | 11/2005 |
| JP | 2006-229889 A | 8/2006 |
| JP | 2009-213113 A | 9/2009 |
| WO | WO-03/103163 | 12/2003 |

* cited by examiner

*Primary Examiner* — Ted Wang
(74) *Attorney, Agent, or Firm* — Fujitsu Patent Center

(57) ABSTRACT

A distortion compensation device includes a storage unit storing a plurality of distortion compensation coefficients associated with power values of transmission signals, a distortion compensation processing unit acquiring a distortion compensation coefficient corresponding to a power value of a received transmission signal from among the plurality of distortion compensation coefficients and subjecting the received transmission signal to a distortion compensation process on the basis of the acquired distortion compensation coefficient, a phase calculating unit calculating a phase correction value on the basis of the distortion compensation coefficients, a phase correcting unit generating a reference signal by correcting a phase of the received transmission signal on the basis of the phase correction value, and a correction processing unit performing a correction process for the transmission signal subjected to the distortion compensation process on the basis of the reference signal and a feedback signal from a transmission power amplifier.

16 Claims, 11 Drawing Sheets

| p | h(p) |
|---|---|
| p0 | h(p0) |
| p1 | h(p1) |
| ⋮ | ⋮ |
| pi | h(pi) |
| ⋮ | ⋮ |
| p1023 | h(p1023) |

DISTORTION COMPENSATION DEVICE, DISTORTION COMPENSATION METHOD AND WIRELESS APPARATUS

CROSS-REFERENCE TO RELATED APPLICATION

This application is based upon and claims the benefit of priority of the prior Japanese Patent Applications No. 2010-277487, filed on Dec. 13, 2010, the entire contents of which are incorporated herein by reference.

FIELD

The embodiments disclosed herein relate to a distortion compensation device, a distortion compensation method, and a wireless apparatus.

BACKGROUND

When a multi-phase modulation method is used for wireless communication, the following technique is important. The technique is to linearize an amplitude characteristic of a transmission power amplifier, suppress a nonlinear distortion of transmission power and reduce power that leaks to an adjacent channel on a transmission side.

FIG. 1 is a diagram illustrating an input/output characteristic of a transmission power amplifier. FIG. 2 is a diagram illustrating a frequency spectrum of transmission power.

For wireless communication such as W-CDMA, transmission power of a wireless apparatus is large, and the input/output characteristic of the transmission power amplifier indicates a nonlinear characteristic as indicated by a solid line of FIG. 1. A dotted line of FIG. 1 indicates an ideal input/output characteristic. The nonlinear characteristic causes a nonlinear distortion. Thus, the transmission power amplifier has a distortion function f(p) for input power p.

As illustrated in FIG. 2, a spectrum of frequencies that are close to a transmission frequency f0 is changed by the nonlinear distortion from an ideal characteristic "a" indicated by a dashed line to a characteristic "b" indicated by a solid line so that side lobes rise. Thus, a part of transmission power of a transmission channel has the transmission frequency f0, leaks to an adjacent channel, and thereby causes an adjacency failure. The leaking power becomes noise for the other channel and degrades a communication quality of the channel.

When transmission power is in a linear range (for example, a linear region 1 illustrated in FIG. 1) of the input/output characteristic of the transmission power amplifier, the amount of leaking power is small. When the transmission power is in a nonlinear range (for example, a nonlinear region 2 illustrated in FIG. 1) of the input/output characteristic of the transmission power amplifier, the amount of leaking power is large. In order to achieve a high-power transmission power amplifier, it is preferable to increase the linear range. However, in order to increase the linear range, it is preferable that the amplifier exhibits higher performance than actually wanted performance. This may be a disadvantage in the cost and size of a device. To avoid this, a function of compensating for a nonlinear distortion of transmission power is added to the wireless apparatus.

For wireless communication, with an increase in a transmission signal band, a direct radio frequency (RF) modulation method for directly converting a baseband signal into a signal of a radio frequency (hereinafter referred to as RF) band without conversion of the baseband signal into a signal of an intermediate frequency band has attracted attention.

However, when the direct RF modulation method is used, an in-phase component signal (hereinafter referred to as I signal) and a quadrature component signal (hereinafter referred to as Q signal), which are input to a quadrature modulator, may have errors owing to an individual variation in an analog element forming a digital/analog (D/A) converter or the quadrature modulator, a change in the analog element over time, or the like. In addition, an image component (unwanted wave component) may be generated in a modulated analog transmission signal. The image component (unwanted wave component) may reduce the quality of the transmission signal.

In order to reduce the errors in the I and Q signals and reduce the image component (unwanted wave component) generated in the modulated analog transmission signal, a function of performing an RF correction process on the I and Q signals of the transmission baseband signal is added to the wireless apparatus. The RF correction process is a process that is performed to correct a quadrature deviation, amplitude deviations and DC offsets of the I and Q signals. The quadrature deviation, amplitude deviations and DC offsets of the I and Q signals occur in the D/A converter and the quadrature modulator.

FIG. 3 is a diagram illustrating an example of an internal configuration of a conventional distortion compensation device 300 that has a distortion compensation function and an RF correction function. As illustrated in FIG. 3, the distortion compensation device 300 includes a distortion compensation processing unit 301, a distortion compensation coefficient storage unit 302, a distortion compensation coefficient calculating unit 303 and an RF correction processing unit 304. The distortion compensation device 300 receives a transmission baseband signal x(t) from a transmission signal generating device (not illustrated).

The distortion compensation coefficient storage unit 302 stores a plurality of distortion compensation coefficients h(p) that are associated with power values p of the transmission baseband signal x(t). The distortion compensation coefficient storage unit 302 selects, from among the plurality of distortion compensation coefficients h(p), a distortion compensation coefficient h(p) that corresponds to a power value p of the transmission baseband signal x(t) received by the distortion compensation processing unit 301. The distortion compensation coefficient storage unit 302 outputs the selected distortion compensation coefficient h(p) to the distortion compensation processing unit 301.

The distortion compensation processing unit 301 receives the transmission baseband signal x(t) from the transmission signal generating device (not illustrated) and receives the distortion compensation coefficient h(p) from the distortion compensation coefficient storage unit 302. The distortion compensation processing unit 301 performs a distortion correction process on the received transmission baseband signal x(t) on the basis of the distortion compensation coefficient h(p) and generates a transmission baseband signal x1(t).

The distortion compensation coefficient calculating unit 303 receives the transmission baseband signal x(t) and a feedback signal y(t). The feedback signal y(t) is a signal generated by demodulating a signal output from a transmission power amplifier (not illustrated). The distortion compensation coefficient calculating unit 303 calculates a distortion compensation coefficient so that the difference between the transmission baseband signal x(t) and the feedback signal y(t) is zero. The distortion compensation coefficient calculating unit 303 updates an interested distortion compensation coefficient h(p) stored in the distortion compensation coefficient storage unit 302 on the basis of the calculated distortion compensation coefficient.

The RF correction processing unit 304 receives the transmission baseband signal x1(t) after the distortion correction process. In addition, the RF correction processing unit 304 receives the transmission baseband signal x(t) before the distortion correction process and the feedback signal y(t). The RF correction processing unit 304 determines correction values for a quadrature deviation, amplitude deviations and DC offsets on the basis of the transmission baseband signal x(t) before the distortion correction process and the feedback signal y(t).

The RF correction processing unit 304 performs the RF correction process on I and Q signals of the transmission baseband signal x1(t) after the distortion correction process on the basis of the determined correction values and generates a transmission baseband signal x2(t).

Examples of the aforementioned distortion compensation process and RF correction process are disclosed in the following patent documents.

The patent documents are Japanese Laid-open Patent Publications Nos. 2001-189685, 2005-311710 and 2006-229889.

In the distortion compensation device 300, the RF correction processing unit 304 performs the RF correction process on the transmission baseband signal x1(t) after the distortion correction process performed by the distortion compensation processing unit 301. However, the RF correction processing unit 304 determines the correction values for the quadrature deviation, the amplitude deviations and the DC offsets on the basis of the transmission baseband signal x(t) before the distortion compensation process and the feedback signal y(t), and performs the RF correction process using the determined correction values.

Thus, an effect of the distortion compensation process that is performed on the transmission baseband signal (I signal, Q signal) is not accurately reflected in the correction values determined by the RF correction processing unit 304, and the RF correction process cannot be performed on the I signal and the Q signal with high accuracy.

Especially, an effect (such as a shift of the phase of the transmission baseband signal after the distortion compensation process performed by the distortion compensation processing unit 301 from the phase of the transmission baseband signal before the distortion compensation process) on a phase component, which is caused by the distortion compensation process, is not reflected in the correction values determined by the RF correction processing unit 304. Thus, the accuracy of the correction that is performed on the quadrature deviation by the RF correction processing unit 304 is not sufficiently ensured.

SUMMARY

According to an aspect of the embodiments, a distortion compensation device is configured to receive a transmission signal and subject the received transmission signal to a distortion compensation process for compensating for a nonlinear distortion caused by a transmission power amplifier. The distortion compensation device includes a distortion compensation coefficient storage unit configured to store a plurality of distortion compensation coefficients associated with power values of the transmission signals, a distortion compensation processing unit configured to acquire a distortion compensation coefficient corresponding to a power value of the received transmission signal from among the plurality of distortion compensation coefficients and to subject the received transmission signal to the distortion compensation process on the basis of the acquired distortion compensation coefficient, a phase calculating unit configured to calculate a phase correction value on the basis of the distortion compensation coefficients stored in the distortion compensation coefficient storage unit, a phase correcting unit configured to generate a reference signal by correcting a phase of the received transmission signal on the basis of the phase correction value, and a correction processing unit configured to perform a correction process for the transmission signal subjected to the distortion compensation process on the basis of the reference signal and a feedback signal, the feedback signal being fed back from the transmission power amplifier.

The object and advantages of the embodiment will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the invention are described below.

1. First Embodiment

1-1. Example of Configuration of Wireless Device 400

Figure 4:
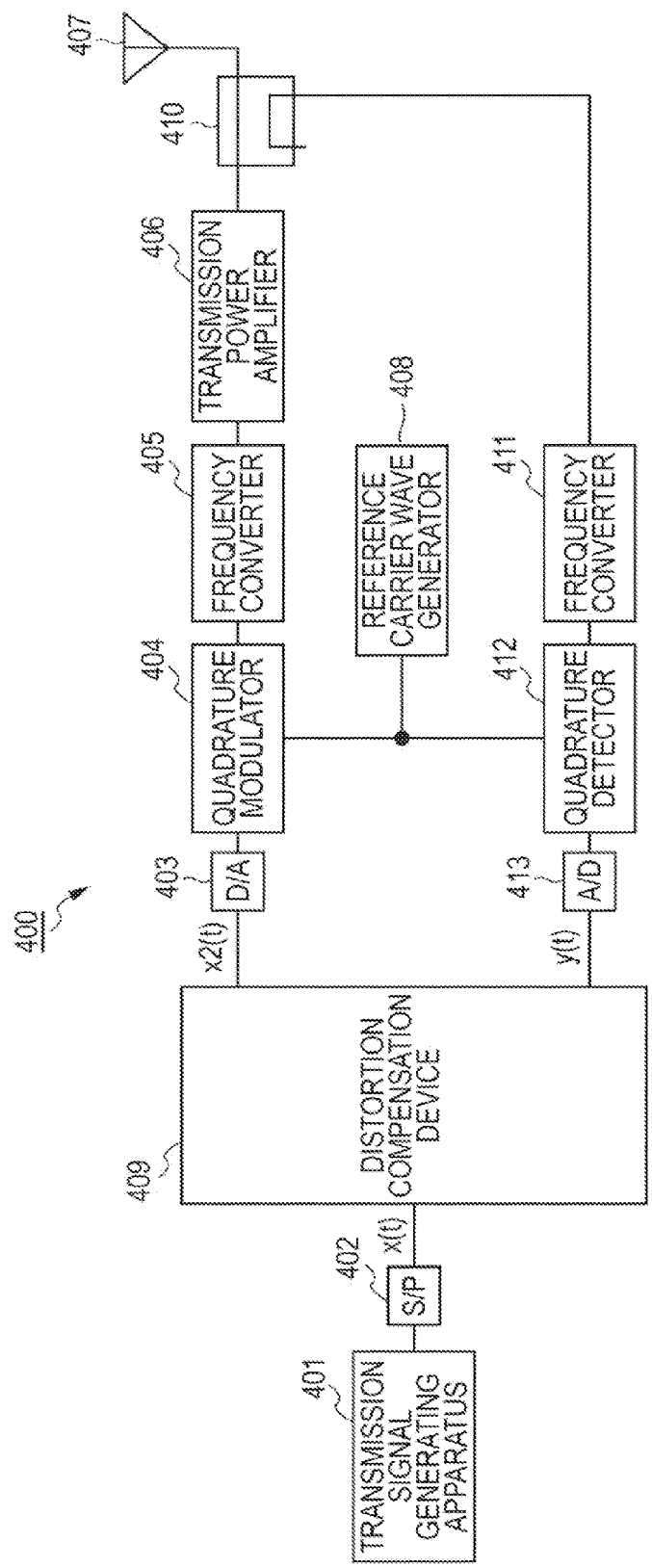
FIG. 4 is a diagram illustrating an example of the configuration of a wireless apparatus according to a first embodiment.

FIG. 4 is a diagram illustrating an example of the configuration of a wireless apparatus 400 according to a first embodiment of the invention.

A serial/parallel (S/P) converter 402 receives a transmission baseband signal from a transmission signal generating device 401. The S/P converter 402 converts the received transmission baseband signal into an in-phase component signal (I signal) and a quadrature component signal (Q signal) and supplies the converted transmission baseband signal (I signal and Q signal) x(t) to a distortion compensation device 409.

The distortion compensation device 409 receives the transmission baseband signal (I signal and Q signal) x(t) from the S/P converter 402 and receives a feedback signal y(t) (described later) from an analog/digital (A/D) converter 413. The distortion compensation device 409 performs a distortion compensation process and an RF correction process on the received transmission baseband signal x(t) using the feedback signal y(t), and generates a transmission baseband signal x2($t$). Details of the distortion compensation device 409 are described later.

A digital/analog (D/A) converter 403 receives, from the distortion compensation device 409, the transmission baseband signal (I signal and Q signal) x2($t$) that is constituted by a digital data string. The D/A converter 403 converts the I and Q signals of the transmission baseband signal x2($t$) into an analog transmission baseband signal (I signal and Q signal).

A quadrature modulator 404 receives the analog transmission baseband signal (I signal and Q signal) from the D/A converter 403. The quadrature modulator 404 performs a quadrature modulation on the I and Q signals of the analog transmission baseband signal using a reference carrier wave supplied from a reference carrier wave generator 408 and a carrier wave having a phase shifted by 90° from the phase of the reference carrier wave.

A frequency converter 405 receives the transmission baseband signal subjected to the quadrature modulation, mixes the received transmission baseband signal with a local oscillation signal, and converts the frequency of the mixed transmission signal to a radio frequency (RF).

A transmission power amplifier 406 receives the transmission signal having the radio frequency (RF) from the frequency converter 405. The transmission power amplifier 406 amplifies the power of the radio frequency transmission signal and wirelessly transmits the amplified radio frequency transmission signal in the air through an antenna 407.

A part of the radio frequency transmission signal that is output from the transmission power amplifier 406 is input to a frequency converter 411 through a directional coupler 410. The frequency converter 411 converts the frequency of the received radio frequency (RF) transmission signal to the original baseband frequency.

A quadrature detector 412 receives the transmission baseband signal (I signal and Q signal) output from the frequency converter 411. The quadrature detector 412 performs a quadrature detection process on the I and Q signals of the received transmission baseband signal using the reference carrier wave supplied from the reference carrier wave generator 408 and the carrier wave having the phase shifted by 90° from the phase of the reference carrier wave. Thus, the quadrature detector 412 reproduces the I and Q signals of the transmission baseband signal input to the quadrature modulator 404.

The A/D converter 413 receives the reproduced analog transmission baseband signal (I signal and Q signal) and converts the I and Q signals of the received transmission baseband signal into a digital transmission baseband signal (I signal and Q signal). The A/D converter 413 supplies the converted signal as the feedback signal y(t) to the distortion compensation device 409. The frequency converter 411, the quadrature detector 412 and the A/D converter 413 function as a feedback circuit that feeds the signal output from the transmission power amplifier 406 back to the distortion compensation device 409.

1-2. Example of Configuration of Distortion Compensation Device 409

Figure 5:
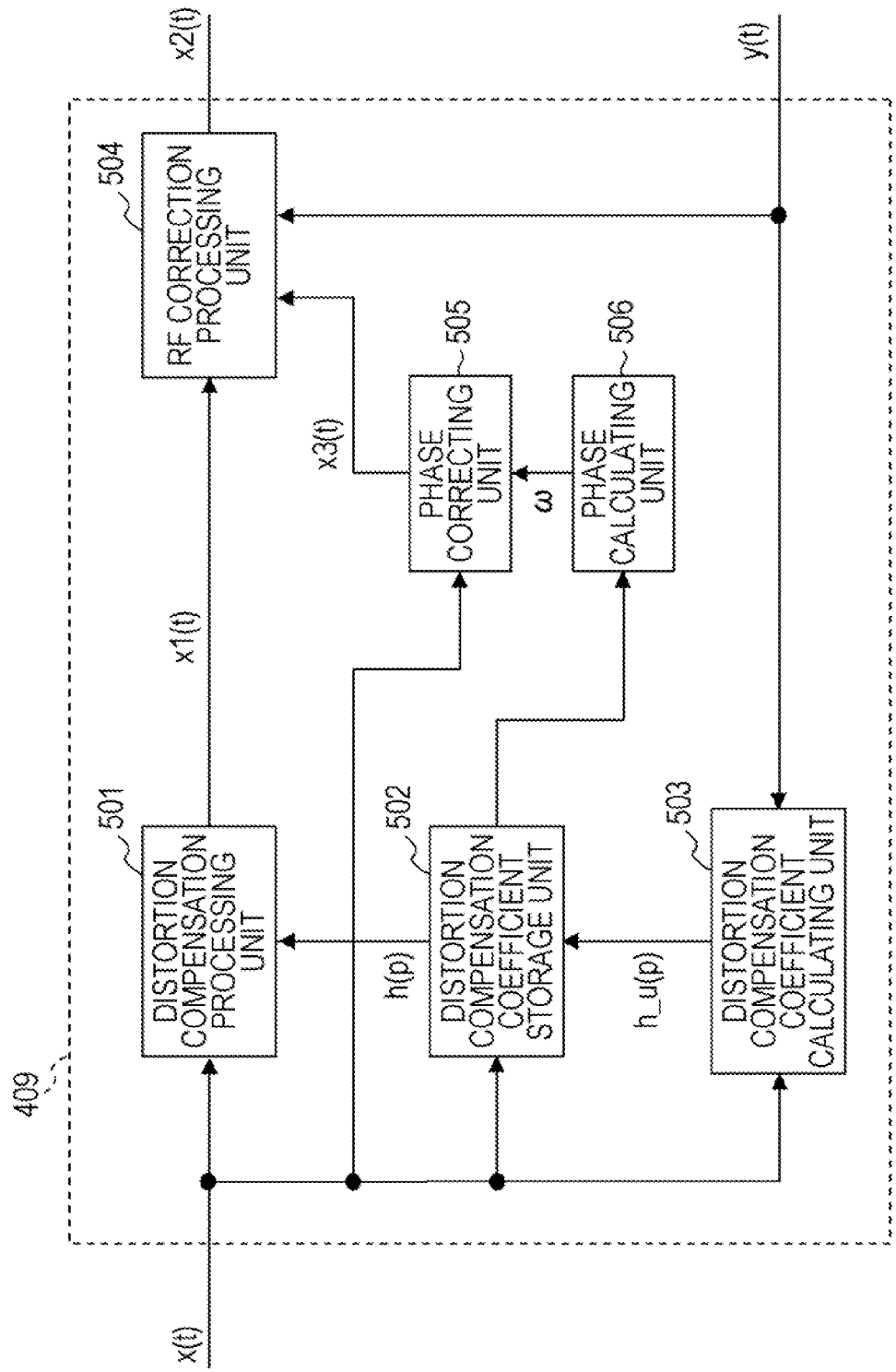
FIG. 5 is a diagram illustrating an example of the configuration of a distortion compensation device according to the first embodiment.

FIG. 5 is a diagram illustrating an example of the configuration of the distortion compensation device 409 according to the first embodiment of the invention. The distortion compensation device 409 is a digital signal processing device such as a field programmable gate array (FPGA), an application specific integrated circuit (ASIC) or a digital signal processor (DSP). The distortion compensation device 409 includes a distortion compensation processing unit 501, a distortion compensation coefficient storage unit 502, a distortion compensation coefficient calculating unit 503, an RF correction processing unit 504, a phase correcting unit 505 and a phase calculating unit 506 as internal circuit blocks.

The distortion compensation processing unit 501 receives the transmission baseband signal x(t) and extracts a distortion compensation coefficient h(p) from the distortion compensation coefficient storage unit 502. The distortion compensation processing unit 501 receives the distortion compensation coefficient h(p), performs a distortion compensation process on the transmission baseband signal x(t) on the basis of the received distortion compensation coefficient h(p), and generates a transmission baseband signal x1($t$).

Figure 1:
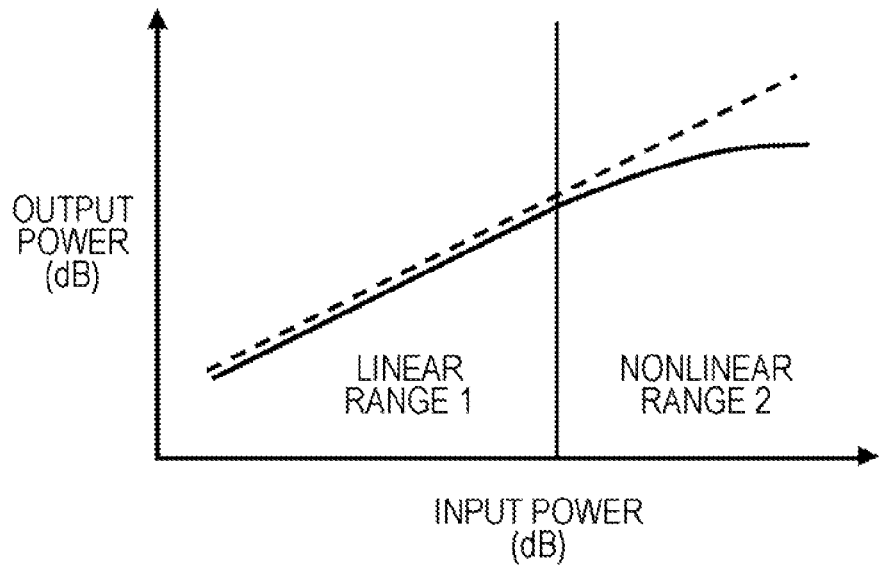
FIG. 1 is a diagram illustrating an input/output characteristic of a transmission power amplifier.

The distortion compensation process is performed to correct the transmission baseband signal x(t) using a distortion compensation coefficient h(p) corresponding to a power value p of the transmission baseband signal x(t) before the transmission baseband signal is input to the transmission power amplifier 406 so that a nonlinear input/output characteristic (as indicated by the solid line of FIG. 1) of the transmission power amplifier 406 becomes close to a linear input/output characteristic (as indicated by the dotted line of FIG. 1). For example, the distortion compensation processing unit 501 performs a process of multiplying the transmission baseband signal x(t) by the distortion compensation coefficient h(p) so as to generate the transmission baseband signal x1($t$).

The distortion compensation coefficient storage unit 502 stores a plurality of distortion compensation coefficients h(p) that are associated with power values p of the transmission baseband signal x(t). The distortion compensation coefficient storage unit 502 receives the transmission baseband signal x(t) that is the same as the transmission baseband signal x(t) received by the distortion compensation processing unit 501. The distortion compensation coefficient storage unit 502 selects, from among the plurality of distortion compensation coefficients h(p), a distortion compensation coefficient h(p) that corresponds to a power value p of the received transmission baseband signal x(t). The distortion compensation coefficient storage unit 502 outputs the selected distortion compensation coefficient h(p) to the distortion compensation processing unit 501. Details of the distortion compensation coefficient storage unit 502 are described later.

The distortion compensation coefficient calculating unit 503 receives the transmission baseband signal x(t) and the feedback signal y(t) and performs adaptive signal processing using a least mean square (LMS) algorithm. Specifically, the distortion compensation coefficient calculating unit 503 performs the adaptive signal processing using the LMS algorithm so as to compare the transmission baseband signal x(t) before the distortion compensation process to be performed by the distortion compensation processing unit 501 with the feedback signal y(t) transmitted from the transmission power amplifier 406 and calculate a distortion compensation coefficient h_u(p) so that the different between the transmission baseband signal x(t) and the feedback signal y(t) is zero.

The distortion compensation coefficient calculating unit 503 supplies the calculated distortion compensation coefficient h_u(p) as an updated value of the distortion compensation coefficient h(p) to the distortion compensation coefficient storage unit 502. The distortion compensation coefficient calculating unit 503 that performs the adaptive signal processing using the LMS algorithm can have any of various configurations. An example of the configuration of the distortion compensation coefficient calculating unit 503 is illustrated in FIG. 27 of Japanese Laid-open Patent Publication No. 2001-189685.

After the distortion compensation coefficient storage unit 502 outputs the distortion compensation coefficient h(p) to the distortion compensation processing unit 501 as described above, the distortion compensation coefficient storage unit 502 updates, on the basis of the supplied updated distortion compensation coefficient h_u(p), a distortion compensation coefficient h(p) associated with the power value p of the received transmission baseband signal x(t).

The phase correcting unit 505 receives the transmission baseband signal x(t) that is the same as the transmission baseband signal x(t) received by the distortion compensation processing unit 501. In addition, the phase correcting unit 505 receives a phase correction value ω from the phase calculating unit 506. The phase correcting unit 505 corrects the phase of the transmission baseband signal x(t) before the distortion compensation process on the basis of the received phase correction value ω, and thereby generates a reference baseband signal x3(t). For example, the phase correcting unit 505 performs a process of adding the phase correction value ω to a phase component of the transmission baseband signal x(t) and thereby generates the reference baseband signal x3(t). The phase correcting unit 505 outputs the generated reference baseband signal x3(t) to the RF correction processing unit 504. Details of the phase correcting unit 505 are described later.

The phase calculating unit 506 receives the plurality of distortion compensation coefficients h(p) stored in the distortion compensation coefficient storage unit 502, and generates the phase correction value ω on the basis of the received distortion compensation coefficients h(p). For example, the phase calculating unit 506 calculates the average of phase components h(p)θ of the received distortion compensation coefficients h(p), and sets the calculated average as the phase correction value ω. The phase calculating unit 506 outputs the generated phase correction value ω to the phase correcting unit 505. Details of the phase calculating unit 506 are described later.

The RF correction processing unit 504 receives the transmission baseband signal x1(t) after the distortion compensation process from the distortion compensation processing unit 501, and performs the RF correction process on the received transmission baseband signal x1(t). The RF correction process is performed to correct a quadrature deviation, amplitude deviations and DC offsets of the I and Q signals of the transmission baseband signal. The quadrature deviation, amplitude deviations and DC offsets of the I and Q signals of the transmission baseband signal occur in the D/A converter 403 and the quadrature modulator 404.

The RF correction processing unit 504 receives the reference baseband signal x3(t) from the phase correcting unit 505 and receives the feedback signal y(t). The RF correction processing unit 504 determines correction values for the quadrature deviation, the amplitude deviations and the DC offsets on the basis of the received reference baseband signal x3(t) and the received feedback signal y(t), while the determined correction values are used for the aforementioned RF correction process.

The RF correction processing unit 504 performs the RF correction process on the I and Q signals of the transmission baseband signal x1(t) after the distortion compensation process on the basis of the determined correction values, and generates a transmission baseband signal x2(t). Details of the RF correction processing unit 504 are described later.

As described above, in the distortion compensation device 409 according to the first embodiment, the RF correction processing unit 504 determines the correction values for the quadrature deviation, the amplitude deviations and the DC offsets on the basis of the reference baseband signal x3(t) and the feedback signal y(t). The reference baseband signal x3(t) is a signal obtained by correcting the phase of the transmission baseband signal x(t) before the distortion compensation process on the basis of the phase correction value ω. In this case, an effect of the distortion compensation process performed by the distortion compensation processing unit 501 is already reflected in the phase correction value ω through the distortion compensation coefficients h(p) stored in the distortion compensation coefficient storage unit 502.

Thus, the effect of the distortion compensation process that is performed by the distortion compensation processing unit 501 can be appropriately reflected in the reference baseband signal x3(t) received by the RF correction processing unit 504 in the distortion compensation device 409 according to the first embodiment. Therefore, the effect of the distortion compensation process that is performed by the distortion compensation processing unit 501 can be appropriately reflected in the correction values determined by the RF correction processing unit 504. It is, therefore, possible to improve the accuracy of the RF correction process that is performed on the transmission baseband signal after the distortion compensation process.

Since the phase correction value ω is generated by calculating the average of the phase components h(p)θ of the distortion compensation coefficients h(p), an effect (such as a shift of the phase of the transmission baseband signal after the distortion compensation process from the phase of the transmission baseband signal before the distortion compensation process) on a phase component, which is caused by the distortion compensation process, can be appropriately reflected in the reference baseband signal x3(t). Thus, the effect of the distortion compensation process that is performed by the distortion compensation processing unit 501 can be appropriately reflected in the correction value determined for the quadrature deviation by the RF correction processing unit 504. It is, therefore, possible to improve the accuracy of the correction that is performed on the quadrature deviation of the transmission baseband signal after the distortion compensation process.

In the distortion compensation device 409 according to the first embodiment, the effect of the distortion compensation process that is performed by the distortion compensation processing unit 501 is estimated by calculating the phase correction value using the distortion compensation coefficients h(p) stored in the distortion compensation coefficient storage unit 502. Thus, a part of an existing circuit to be used for the distortion compensation process can be used for the RF correction process. It is, therefore, possible to improve the accuracy of the RF correction process, especially, the accuracy of the correction process that is performed on the quadrature deviation, while an increase in the circuit size is suppressed.

1-3. Example of Configuration of Distortion Compensation Coefficient Storage Unit 502

Figures 6A, 6B:
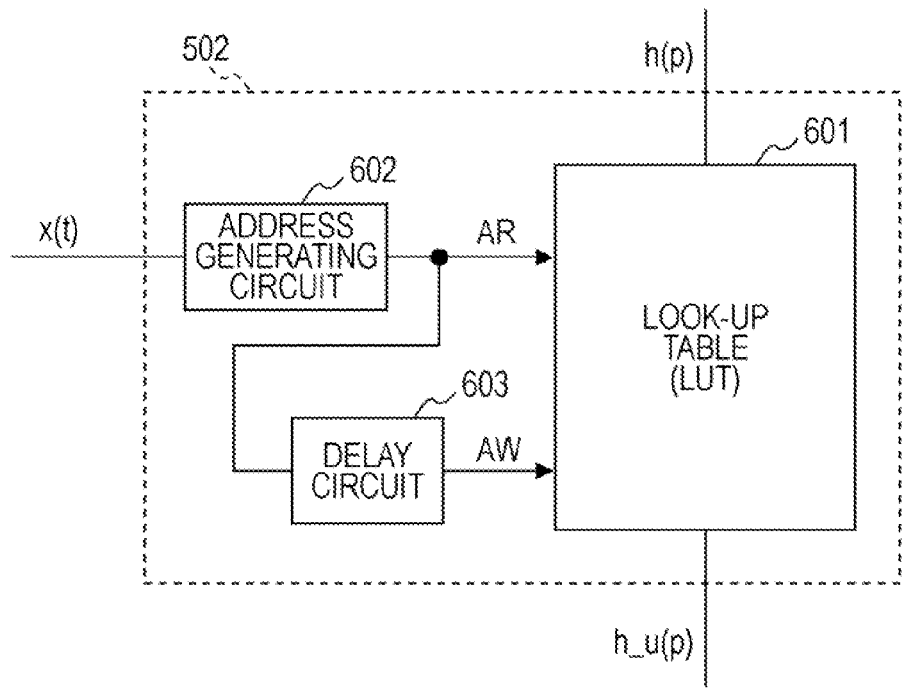
FIG. 6A is a diagram illustrating an example of the configuration of a distortion compensation coefficient storage unit.
FIG. 6B is a diagram illustrating an example of the configuration of a lookup table.

FIG. 6A is a diagram illustrating an example of the configuration of the distortion compensation coefficient storage unit 502. FIG. 6B is a diagram illustrating an example of the configuration of a look-up table (LUT) 601. As illustrated in FIG. 6A, the distortion compensation coefficient storage unit 502 includes the look-up table (LUT) 601, an address generating circuit 602 and a delay circuit 603.

The address generating circuit 602 receives the transmission baseband signal x(t) that is the same as the transmission baseband signal x(t) received by the distortion compensation processing unit 501. The address generating circuit 602 calculates the power value p of the received transmission baseband signal x(t). For example, the power value p can be obtained by calculating the square of an absolute value of the transmission baseband signal x(t), or the power value $p=|x(t)|^2$. The address generating circuit 602 generates an address AR that corresponds to the calculated power value p.

For example, the address generating circuit 602 generates an address (row address) in X direction so that the row address uniquely corresponds to a power value p(t) of the transmission baseband signal x(t), while the power value p(t) is obtained at a current reference time t. The address generating circuit 602 stores a power value p(t−1) of a transmission baseband signal x(t−1), while the power value p(t−1) is obtained at a previous reference time (t−1). The address generating circuit 602 calculates the difference $\Delta p\ (=p(t)-p(t-1))$ between the power value p(t) at the current reference time and the power value p(t−1) at the previous reference time (t−1). The address generating circuit 602 generates an address (column address) in Y direction so that the column address uniquely corresponds to the difference $\Delta p$. The address generating circuit 602 outputs the generated address (row address) in X direction and the generated address (column address) in Y direction as the address AR.

The look-up table (LUT) 601 is a RAM, for example. As illustrated in FIG. 6B, a distortion compensation coefficient h(pi) that is associated with a power value pi of the transmission baseband signal x(t) is stored at a storage position indicated by the address AR corresponding to the power value pi in the look-up table (LUT) 601.

In the look-up table (LUT) 601 illustrated in FIG. 6B, 1024 pairs of power values pi(i=0 to 1023) of the transmission baseband signal x(t) and distortion compensation coefficients h(pi) corresponding to the power values pi are associated with each other and stored. The look-up table (LUT) 601 receives the address AR from the address generating circuit 602 and reads the interested distortion compensation coefficient h(p) from the storage position indicated by the address AR. The look-up table (LUT) 601 outputs the read distortion compensation coefficient h(p) to the distortion compensation processing unit 501.

In this manner, the distortion compensation coefficient storage unit 502 selects, from among the plurality of distortion compensation coefficients, a distortion compensation coefficient h(p) corresponding to the power value p of the transmission baseband signal x(t) that is the same as the transmission baseband signal x(t) received by the distortion compensation processing unit 501. The distortion compensation coefficient storage unit 502 outputs the selected distortion compensation coefficient h(p) to the distortion compensation processing unit 501.

The delay circuit 603 receives the address AR and delays outputting of the address AR by a predetermined time so as to output an address AW. The address AW is output at a time that is different from the time when the address AR is output. However, the address AR and the address AW have the same address information.

The look-up table (LUT) 601 receives the address AW from the delay circuit 603 and receives the updated distortion compensation coefficient h_u(p) from the distortion compensation coefficient calculating unit 503. After the look-up table 601 outputs, to the distortion compensation processing unit 501, the distortion compensation coefficient h(p) read from the storage position indicated by the address AR, the look-up table 601 updates, on the basis of the updated distortion compensation coefficient h_u(p), the distortion compensation coefficient h(p) that is located at the storage position indicated by the address AW and corresponds to the power value p.

1-4. Example of Configuration of RF Correction Processing Unit 504

Figure 7:
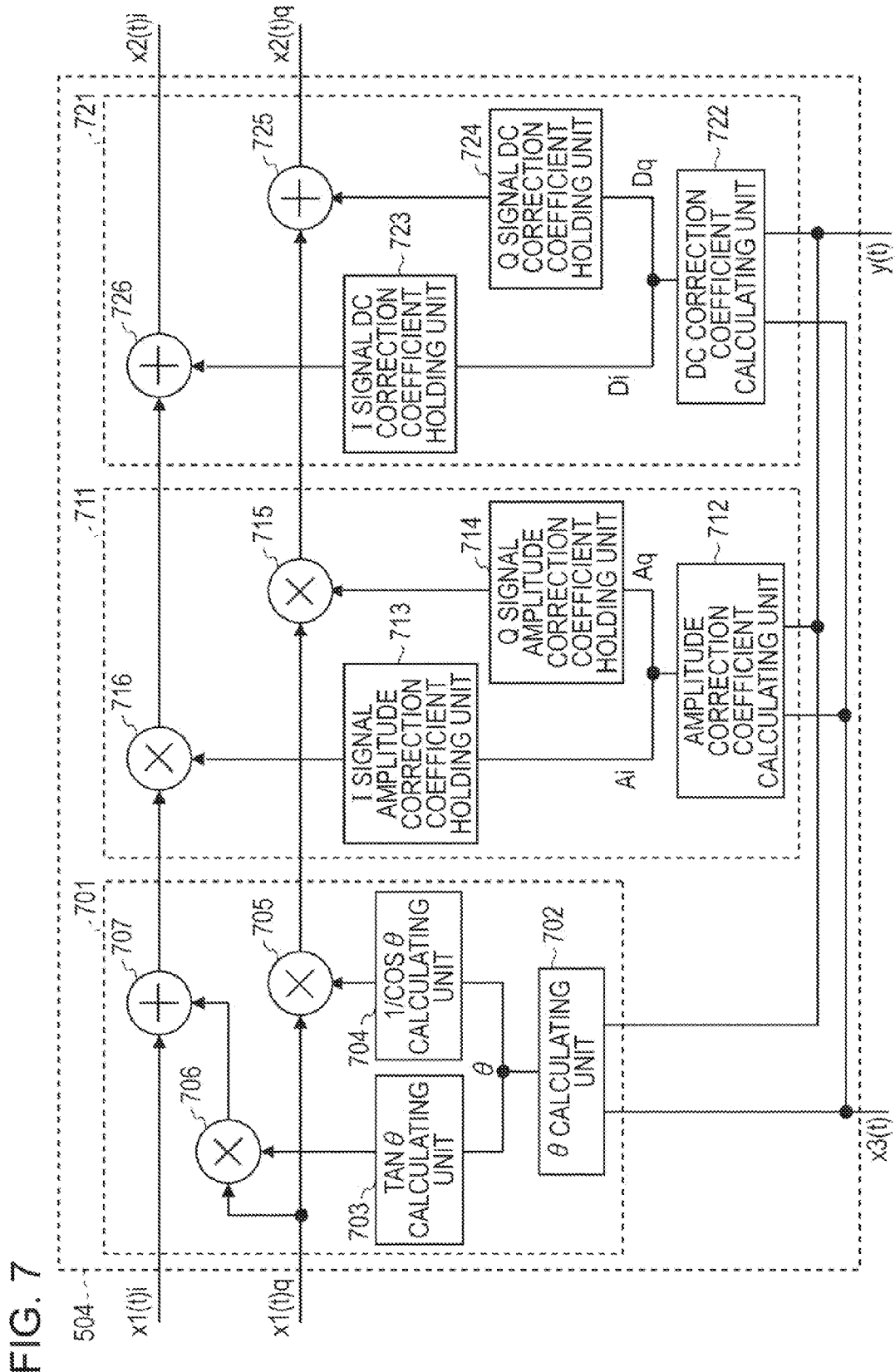
FIG. 7 is a diagram illustrating an example of the configuration of an RF correction processing unit.

FIG. 7 is a diagram illustrating an example of the configuration of the RF correction processing unit 504. As illustrated in FIG. 7, the RF correction processing unit 504 includes a quadrature deviation correcting unit 701, an amplitude deviation correcting unit 711 and a DC offset correcting unit 721 as internal circuit blocks. The RF correction processing unit 504 receives the transmission baseband signal $x1(t)$ after the distortion compensation process, the reference baseband signal $x3(t)$ and the feedback signal y(t).

The quadrature deviation correcting unit 701 corrects the quadrature deviation of the I and Q signals of the transmission baseband signal $x1(t)$. The amplitude deviation correcting unit 711 corrects the amplitude deviations (differences of power) of the I and Q signals. The DC offset correcting unit 721 corrects the DC offsets of the I and Q signals. Details of the quadrature deviation correcting unit 701, details of the amplitude deviation correcting unit 711 and details of the DC offset correcting unit 721 are described below.

1-4-1. Example of Configuration of Quadrature Deviation Correcting Unit 701

Referring to FIG. 7, the quadrature deviation correcting unit 701 includes a θ calculating unit 702, a tan θ calculating unit 703, a 1/cos θ calculating unit 704, multipliers 705, 706 and an adder 707 as internal circuit blocks. The quadrature deviation correcting unit 701 receives the transmission baseband signal $x1(t)$ after the distortion compensation process, the reference baseband signal $x3(t)$ and the feedback signal y(t).

The θ calculating unit 702 receives the reference baseband signal $x3(t)$ from the phase correcting unit 505 and receives the feedback signal y(t). The θ calculating unit 702 generates a quadrature deviation correction parameter θ on the basis of the received reference baseband signal $x3(t)$ and the received feedback signal y(t).

The quadrature deviation correction parameter θ is a parameter that is used to correct the quadrature deviation of the I and Q signals. The quadrature deviation of the I and Q signals occurs mainly in the downstream-side quadrature modulator 404. Specifically, the quadrature deviation correction parameter θ plays a role in correcting displacement (quadrature deviation) of the quadrature relationship between a real axis and an imaginary axis on a complex plane on which a trajectory of the I signal of the transmission baseband signal over time and a trajectory of the Q signal of the transmission baseband signal over time are represented so that the real axis and the imaginary axis accurately form an angle of 90°.

The θ calculating unit 702 supplies the generated quadrature deviation correction parameter θ to the tan θ calculating unit 703 and the 1/cos θ calculating unit 704. The θ calculating unit 702 can have any of various configurations. An example of the configuration of the θ calculating unit 702 is illustrated in FIG. 23 of Japanese Laid-open Patent Publication No. 2005-311710.

The tan θ calculating unit 703 receives the quadrature deviation correction parameter θ from the θ calculating unit 702, and calculates a coefficient tan θ on the basis of the received quadrature deviation correction parameter θ. The 1/cos θ calculating unit 704 receives the quadrature deviation correction parameter θ from the θ calculating unit 702, and calculates a coefficient 1/cos θ on the basis of the received quadrature deviation correction parameter θ.

The multipliers 705, 706 and the adder 707 correct the quadrature deviation by performing the following calculations on the I signal x1(t)i and Q signal x1(t)i of the transmission baseband signal x1(t) after the distortion compensation process on the basis of the coefficient calculated by the tan θ calculating unit 703 and the coefficient calculated by the 1/cos θ calculating unit 704.

The results of the calculations that are performed by the multipliers 705, 706 and the adder 707 are expressed by the following Equations (hereinafter referred to as Equations 1). Processes that are performed by the amplitude deviation correcting unit 711 and the DC offset correcting unit 721 are not considered for convenience of the explanation.

$$x2(t)i = x1(t)i + x1(t)q \times \tan\theta$$

$$x2(t)q = x1(t)q \times 1/\cos\theta$$

When the I and Q signals to which a quadrature deviation φ is added owing to the downstream-side quadrature modulator 404 or the like are indicated by x4(t)i and x4(t)q, respectively, it is known that the I signal x4(t)i and the Q signal x4(t)q are expressed by the following Equations (hereinafter referred to as Equations 2).

$$x4(t)i = x2(t)i - x2(t)q \times \sin\phi$$

$$x4(t)q = x2(t)q \times \cos\phi$$

When the I signal and the Q signal for which the quadrature deviation is corrected using the quadrature deviation correction parameter θ according to the Equations 1 and 2 are processed by the downstream-side quadrature modulator 404 or the like, the quadrature deviation φ is added. As a result, the I and Q signals to be output are expressed according to the following Equations (hereinafter referred to as Equations 3).

$$x4(t)i = x2(t)i - x2(t)q \times \sin\phi$$
$$= x1(t)i + x1(t)q \times \tan\theta - x1(t)q \times 1/\cos\theta \times \sin\phi$$

$$x4(t)q = x2(t)q \times \cos\phi$$
$$= x1(t)q \times 1/\cos\theta \times \cos\phi$$

In this case, the θ calculating unit 702 generates the quadrature deviation correction parameter θ on the basis of the reference baseband signal x3(t) and the feedback signal y(t). The reference baseband signal x3(t) is a signal in which the effect (such as the shift of the phase of the transmission baseband signal after the distortion compensation process from the phase of the transmission baseband signal before the distortion compensation process) on the phase component, which is caused by the distortion compensation process, is appropriately reflected by the phase correction value ω generated on the basis of the distortion compensation coefficients h(p) stored in the look-up table (LUT) 601 as described above.

Thus, the θ calculating unit 702 can calculates the quadrature deviation correction parameter θ with high accuracy so that the value of the quadrature deviation correction parameter θ matches the value of the quadrature deviation φ that has occurred in the downstream-side quadrature modulator 404 or the like (θ≅φ).

In the example illustrated in FIG. 7, when θ≅φ in the Equations 3, the following formulas are established.

$$x4(t)i = x1(t)i + x1(t)q \times \tan\theta - x1(t)q \times 1/\cos\theta \times \sin\phi$$
$$\cong x1(t)i + x1(t)q \times \tan\phi - x1(t)q \times 1/\cos\phi \times \sin\phi$$
$$\cong x1(t)i$$

$$x4(t)q = x1(t)q \times 1/\cos\theta \times \cos\phi$$
$$\cong x1(t)q \times 1/\cos\phi \times \cos\phi$$
$$\cong x1(t)q$$

In this manner, the quadrature deviation correcting unit 701 corrects the quadrature deviation of the transmission baseband signal x1(t) after the distortion compensation process by performing the aforementioned calculations, and can substantially eliminate an effect of the quadrature deviation φ.

Thus, the quadrature deviation correcting unit 701 of the RF correction processing unit 504 can appropriately reflect the effect of the distortion compensation process performed by the distortion compensation processing unit 501 in the quadrature deviation correction parameter θ, and can accurately calculate the quadrature deviation correction parameter θ. It is, therefore, possible to improve the accuracy of the correction process that is performed on the quadrature deviation of the transmission baseband signal after the distortion compensation process.

1-4-2. Example of Configuration of Amplitude deviation Correcting Unit 711

Referring to FIG. 7, the amplitude deviation correcting unit 711 includes an amplitude correction coefficient calculating unit 712, an I signal amplitude correction coefficient holding unit 713, a Q signal amplitude correction coefficient holding unit 714, a multipliers 715 and 716 as internal circuit blocks. The amplitude deviation correcting unit 711 receives the reference baseband signal x3(t), the feedback signal y(t) and the signal that has been subjected to the correction process performed by the quadrature deviation correcting unit 701 and output from the quadrature deviation correcting unit 701.

The amplitude correction coefficient calculating unit 712 receives the reference baseband signal x3(t) from the phase correcting unit 505 and receives the feedback signal y(t). The amplitude correction coefficient calculating unit 712 generates an amplitude correction coefficient Ai for the I signal and an amplitude correction coefficient Aq for the Q signal on the basis of the received reference baseband signal x3(t) and the received feedback signal y(t). The amplitude correction coefficients Ai and Aq are parameters that are used to correct the amplitude deviations of the I and Q signals. The amplitude deviations of the I and Q signals occur mainly in the downstream-side D/A converter 403 and the downstream-side quadrature modulator 404. The amplitude correction coefficients Ai and Aq play roles in adjusting the balance of amplitudes of the I and Q signals so that a trajectory of the I signal over time and a trajectory of the Q signal over time form accurate circles while the trajectories are represented on a complex plane.

Figure 12:
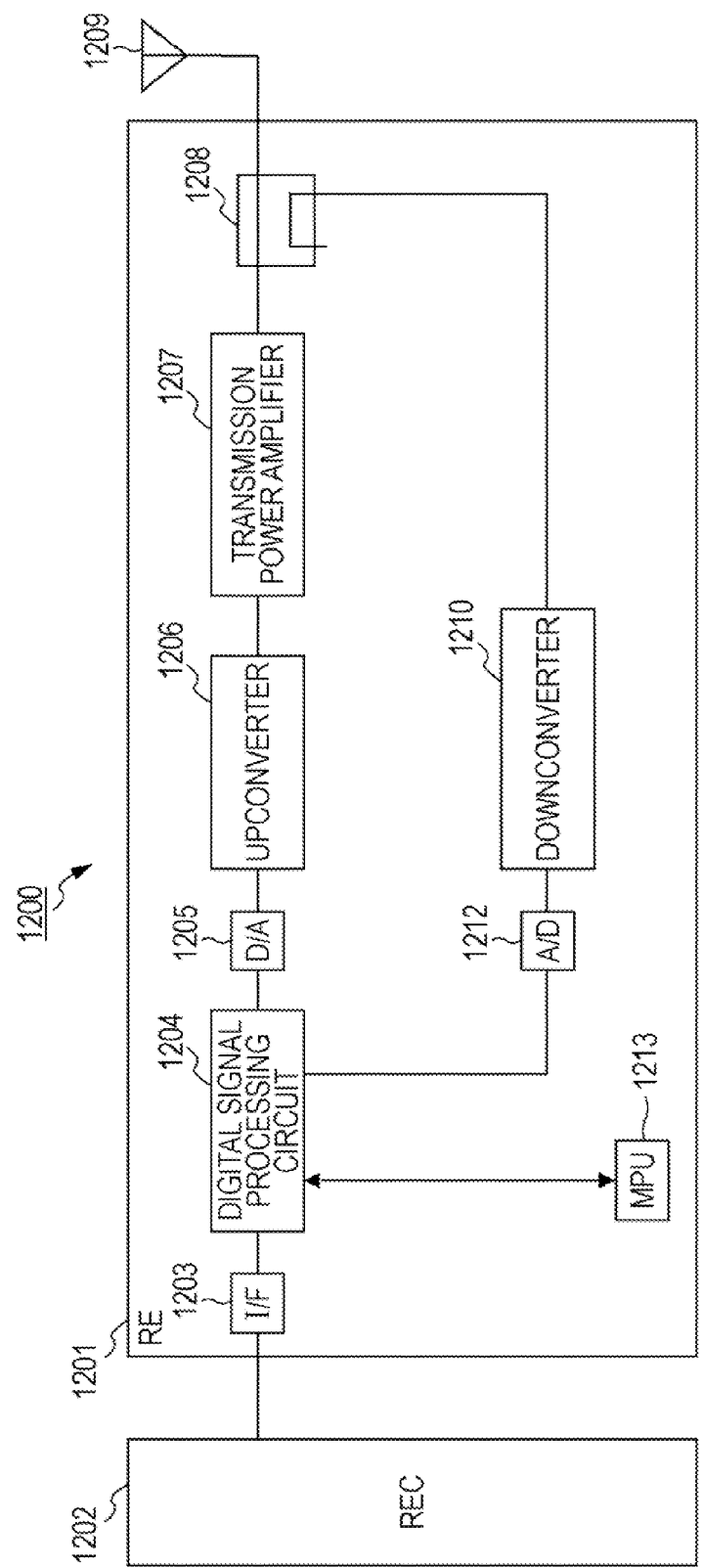
FIG. 12 is a diagram illustrating an example of the configuration of a wireless base station according to a fourth embodiment.

The amplitude correction coefficient calculating unit 712 causes the generated amplitude correction coefficient Ai to be stored in the I signal amplitude correction coefficient holding unit 713 and causes the generated amplitude correction coefficient Aq to be stored in the Q signal amplitude correction coefficient holding unit 714. The amplitude correction coefficient calculating unit 712 can have any of various configurations. An example of the configuration of the amplitude correction coefficient calculating unit 712 is illustrated in FIG. 12 of Japanese Laid-open Patent Publication No. 2005-311710.

The I signal amplitude correction coefficient holding unit 713 supplies the stored I signal amplitude correction coefficient Ai to the multiplier 716. The multiplier 716 corrects the amplitude of the I signal by multiplying the I signal amplitude correction coefficient Ai by the I signal output from the adder 707.

The Q signal amplitude correction coefficient holding unit 714 supplies the stored Q signal amplitude correction coefficient Aq to the multiplier 715. The multiplier 715 corrects the amplitude of the Q signal by multiplying the Q signal amplitude correction coefficient Aq by the Q signal output from the multiplier 705.

In this manner, the amplitude deviation correcting unit 711 can correct the amplitude deviations of the transmission baseband signal x1($t$) after the distortion compensation process.

The reference baseband signal x3($t$) that is received by the amplitude correction coefficient calculating unit 712 is a signal in which the effect of the distortion compensation process performed by the distortion compensation processing unit 501 is appropriately reflected as described above. Thus, the amplitude deviation correcting unit 711 can accurately calculate the I signal amplitude correction coefficient Ai and the Q signal amplitude correction coefficient Aq. It is, therefore, possible to improve the accuracy of the correction process that is performed on the amplitude deviations of the transmission baseband signal after the distortion compensation process.

1-4-3. Example of Configuration of DC Offset Correcting Unit 721

Referring to FIG. 7, the DC offset correcting unit 721 includes a DC correction coefficient calculating unit 722, an I signal DC correction coefficient holding unit 723, a Q signal DC correction coefficient holding unit 724, and adders 725, 726 as internal circuit blocks. The DC offset correcting unit 721 receives the reference baseband signal x3($t$), the feedback signal y(t) and the signal that has been subjected to the correction process performed by the amplitude deviation correcting unit 711 and output from the amplitude deviation correcting unit 711.

The DC correction coefficient calculating unit 722 receives the reference baseband signal x3($t$) from the phase correcting unit 505 and receives the feedback signal y(t). The DC correction coefficient calculating unit 722 generates a DC correction coefficient Di for the I signal and a DC correction coefficient Dq for the Q signal on the basis of the received reference baseband signal x3($t$) and the received feedback signal y(t). The DC correction coefficients Di and Dq are parameters that are used to correct DC offsets of the I and Q signals. The DC offsets of the I and Q signals occur mainly in the downstream-side D/A converter 403. The DC correction coefficients Di and Dq play roles in adjusting delay amounts of the I and Q signals so as to compensate for temporal shifts of the I and Q signals.

Figure 2:
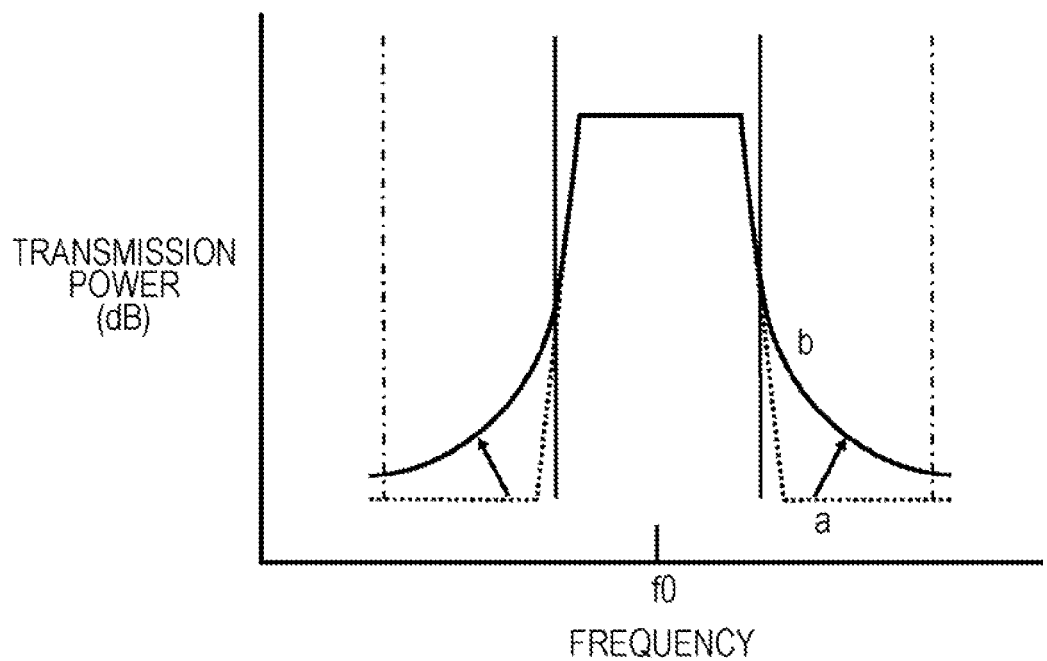
FIG. 2 is a diagram illustrating a frequency spectrum of transmission power.
Figure 3:
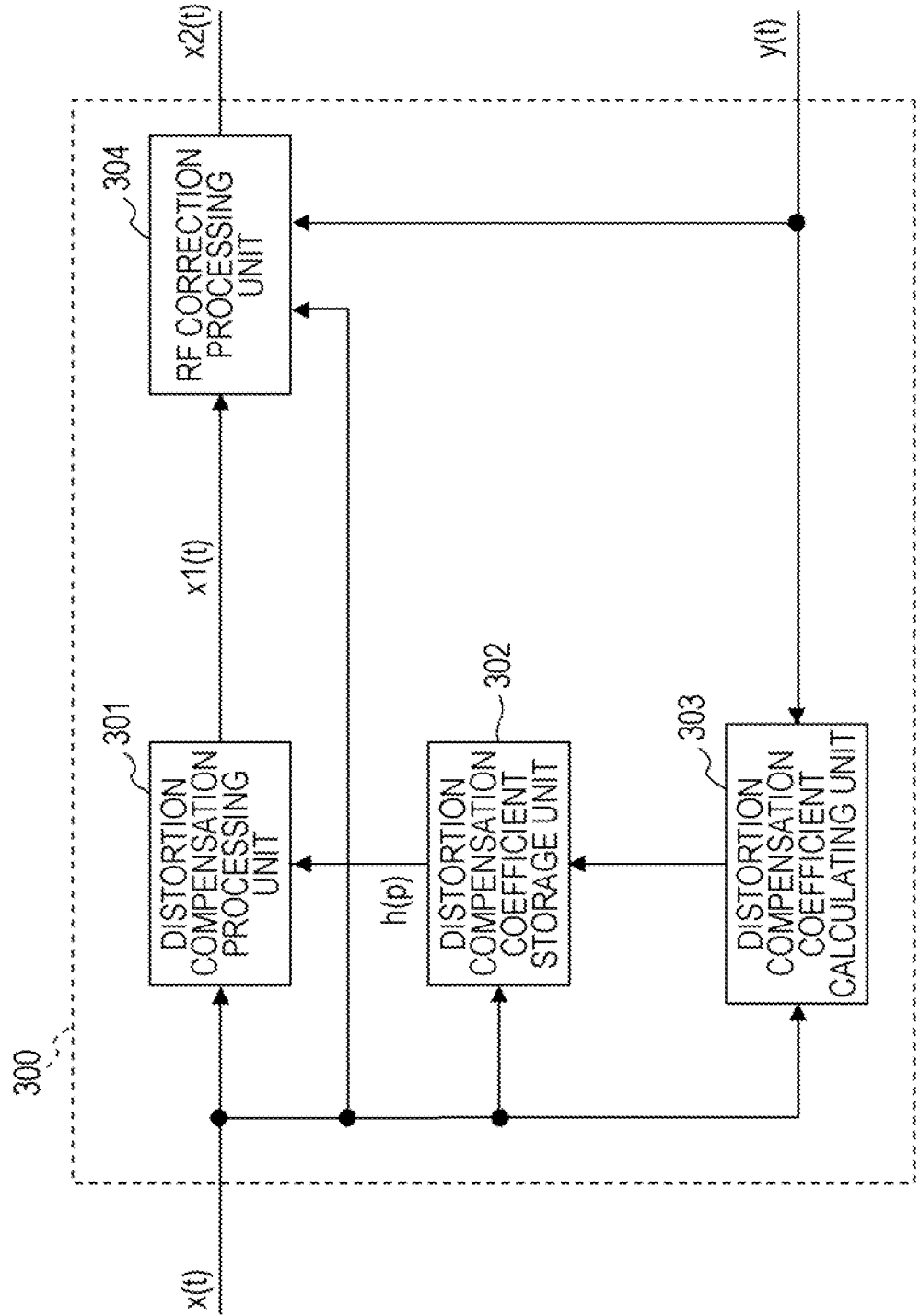
FIG. 3 is a diagram illustrating an example of an internal configuration of a conventional distortion compensation device that has a distortion compensation function and an RF correction function.

The DC correction coefficient calculating unit 722 causes the generated DC correction coefficient Di to be stored in the I signal DC correction coefficient holding unit 723 and causes the generated DC correction coefficient Dq to be stored in the Q signal DC correction coefficient holding unit 724. The DC correction coefficient calculating unit 722 can have any of various configurations. An example of the configuration of the DC correction coefficient calculating unit 722 is illustrated in FIG. 2 of Japanese Laid-open Patent Publication No. 2005-311710.

The I signal DC correction coefficient holding unit 723 supplies the stored I signal DC correction coefficient Di to the adder 726. The adder 726 corrects a DC component of the I signal by adding the I signal DC correction coefficient Di to the I signal output from the multiplier 716.

The Q signal DC correction coefficient holding unit 724 supplies the stored Q signal DC correction coefficient Dq to the adder 725. The adder 725 corrects a DC component of the Q signal by adding the Q signal DC correction coefficient Dq to the Q signal output from the multiplier 715.

In this manner, the DC offset correcting unit 721 can correct the DC offsets of the transmission baseband signal x1($t$) after the distortion compensation process. The DC offset correcting unit 721 outputs the transmission baseband signal x2($t$) after the distortion compensation process as a signal output from the RF correction processing unit 504.

The reference baseband signal x3($t$) that is received by the DC correction coefficient calculating unit 722 is a signal in which the effect of the distortion compensation process performed by the distortion compensation processing unit 501 is appropriately reflected as described above. Thus, the DC offset correcting unit 721 can accurately calculate the I signal DC correction coefficient Di and the Q signal DC correction coefficient Dq. It is, therefore, possible to improve the accuracy of the correction process that is performed on the DC offsets of the transmission baseband signal after the distortion compensation process.

1-5. Example of Configuration of Phase Calculating Unit 506

Figure 8:
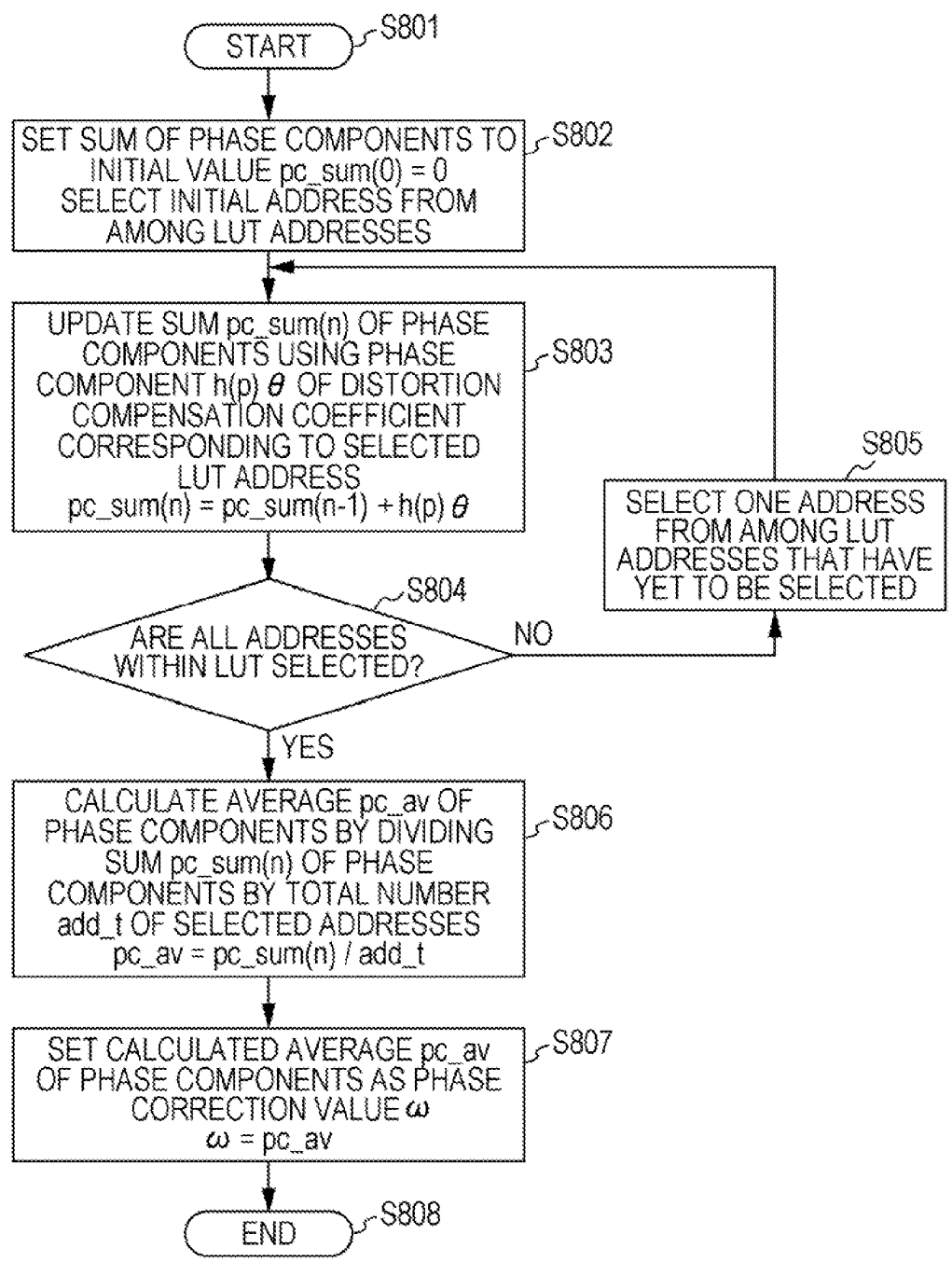
FIG. 8 is a flowchart of an example of a process of calculating a phase correction value while the calculation process is performed by a phase calculating unit.

FIG. 8 is a flowchart of an example of a process of calculating the phase correction value ω, while the process of calculating the phase correction value ω is performed by the phase calculating unit 506. The phase calculating unit 506 is a circuit for performing the calculation process illustrated in the flowchart of FIG. 8. The phase calculating unit 506 can have any of various configurations. For example, the phase calculating unit 506 is achieved as a circuit that includes multiple arithmetic units (including an adder for performing an addition process and a divider for performing a division process), a control circuit for controlling operations of the arithmetic units, and the like.

The calculation process illustrated in FIG. 8 is described below. The calculation process illustrated in FIG. 8 is performed to calculate the average of the phase components h(p)θ of all the distortion compensation coefficients h(p) stored in the look-up table (LUT) 601 and thereby calculate the phase correction value ω.

In step S801, the phase calculating unit 506 starts the process of calculating the phase correction value ω.

In step S802, the phase calculating unit 506 sets the sum pc_sum(n) of the phase components to "0" (initial value) (pc_sum(0)=0). The sum pc_sum(n) of the phase components is a value that indicates the sum of the phase components h(p)θ of the distortion compensation coefficients h(p) stored in the look-up table (LUT) 601.

In addition, the phase calculating unit 506 selects one address as an initial address from among a plurality of addresses at which the distortion compensation coefficients h(p) are stored in the look-up table (LUT) 601. The selection of the initial address changes depending on how the distortion compensation coefficient h(p) that corresponds to the power value p is stored in the look-up table (LUT) 601.

In step S803, the phase calculating unit 506 reads the distortion compensation coefficient h(p) corresponding to the selected address from the look-up table (LUT) 601 and acquires the phase component h(p)θ of the read distortion compensation coefficient h(p). The phase calculating unit 506 updates the sum pc_sum(n) of the phase components by adding the acquired phase component h(p)θ to the current sum pc_sum(n−1) (the initial value is "0") of the phase components as indicated by the following equation.

$$pc\_sum(n) = pc\_sum(n-1) + h(p)\theta$$

In step S804, the phase calculating unit 506 checks whether or not the phase calculating unit 506 has selected all the addresses at which the distortion compensation coefficients h(p) are stored in the look-up table (LUT) 601. If the phase calculating unit 506 has selected all the addresses within the look-up table (LUT) 601, the phase calculating unit 506 causes the calculation process to proceed to a process of step S806. On the other hand, if at least one address that is among the addresses and has yet to be selected exists in the look-up table (LUT) 601, the phase calculating unit 506 causes the calculation process to proceed to a process of step S805.

In step S805, the phase calculating unit 506 selects one address from among addresses that have yet to be selected and at which distortion coefficient coefficients h(p) are stored in the look-up table (LUT) 601. After that, the phase calculating unit 506 causes the calculation process to return to the process of step S803. The phase calculating unit 506 performs the processes of steps S803 and S804 again on the basis of the address selected in step S805.

In step S806, the phase calculating unit 506 calculates the average pc_av of the phase components of the distortion compensation coefficients by dividing the calculated sum pc_sum(n) of the phase components by the total number add_t of the selected addresses as indicated by the following equation.

$$pc\_av = pc\_sum(n) / add\_t$$

In step S807, the phase calculating unit 506 sets the calculated average pc_av of the phase components as the phase correction value ω. In step S808, the phase calculating unit 506 terminates the process of calculating the phase correction value ω.

In the calculation process illustrated in the flowchart of FIG. 8, the phase calculating unit 506 calculates the average of the phase components by selecting all the addresses at which the distortion compensation coefficients h(p) are stored in the look-up table (LUT) 601. Thus, the process of calculating the phase correction value ω can be simply controlled by the phase calculating unit 506, and it is possible to prevent the configuration of a control circuit included in the phase calculating unit 506 from being complicated.

The calculation process illustrated in the flowchart of FIG. 8 can be performed every time the distortion compensation device 409 receives a new transmission baseband signal x(t), for example. However, the calculation process is not limited to this. The calculation process may be performed every time the distortion compensation device 409 receives a predetermined number of transmission baseband signals x(t). In addition, the calculation process may be performed at certain time intervals.

1-6. Example of Configuration of Phase Correcting Unit 505

Figure 9:
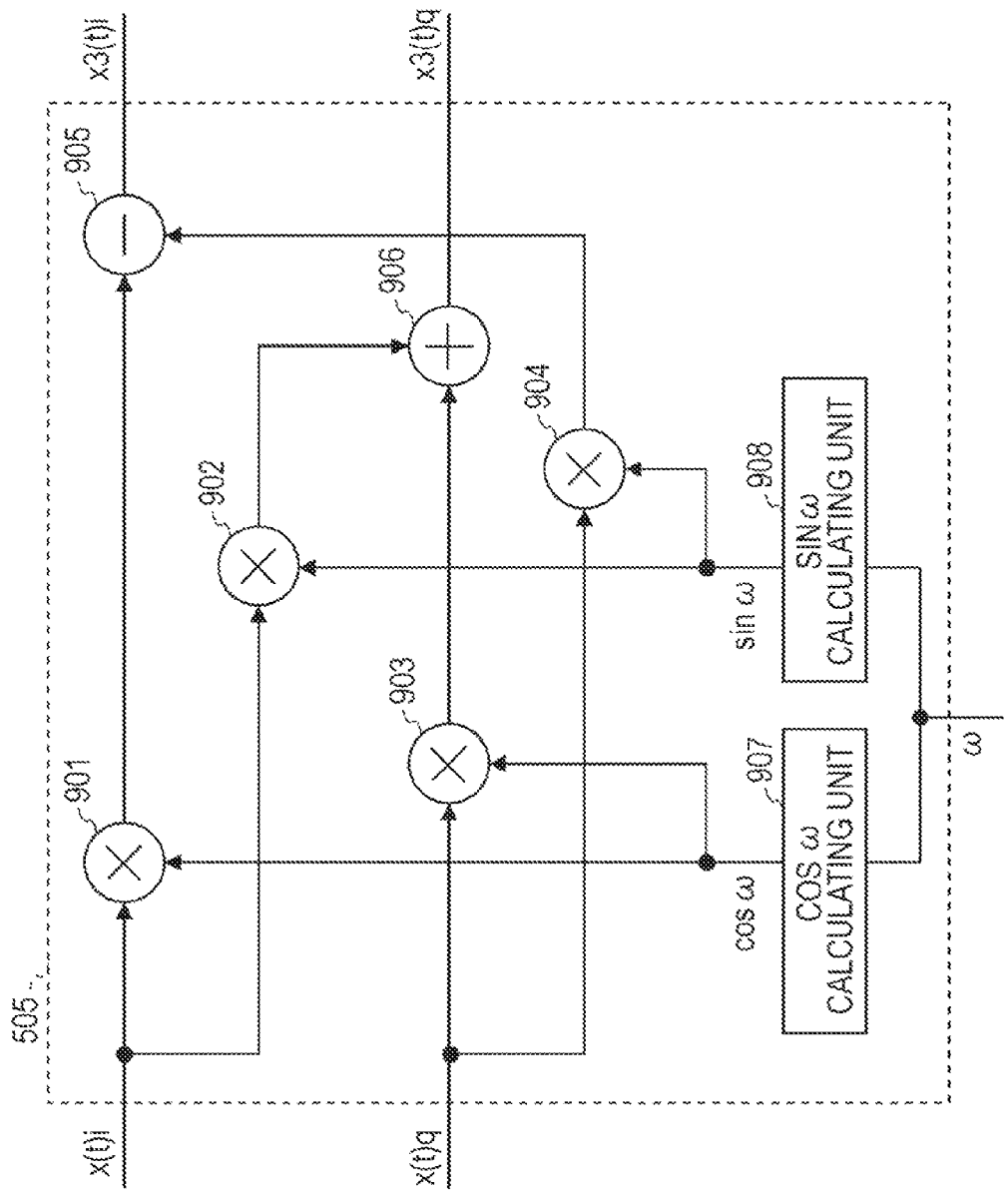
FIG. 9 is a diagram illustrating an example of the configuration of a phase correcting unit.

FIG. 9 is a diagram illustrating an example of the configuration of the phase correcting unit 505. The phase correcting unit 505 includes multipliers 901 to 904, a subtracter 905, an adder 906, a cos ω calculating unit 907 and a sin ω calculating unit 908 as internal circuit blocks. The phase correcting unit 505 receives the transmission baseband signal x(t) before the distortion compensation process and receives the phase correction value ω from the phase calculating unit 506.

The cos ω calculating unit 907 receives the phase correction value ω from the phase calculating unit 506 and calculates a coefficient cos θ on the basis of the received phase correction value ω. The sin ω calculating unit 908 receives the phase correction value ω from the phase calculating unit 506 and calculates a coefficient sin θ on the basis of the received phase correction value ω.

The multipliers 901 to 904, the subtracter 905 and the adder 906 perform the following calculations (complex calculations) on the I signal x(t)i and Q signal x(t)q of the transmission baseband signal x(t) before the distortion compensation process on the basis of the coefficient calculated by the cos ω calculating unit 907 and the coefficient calculated by the sin ω calculating unit 908.

$$x(t) = x(t)i + j \times x(t)q$$

$$w = \cos\omega + j \times \sin\omega = e^{j\omega}$$

$$x3(t) = x3(t)i + j \times x3(t)q$$

$$\begin{aligned}x3(t) &= x(t) \times w \\ &= (x(t)i \times \cos\omega - x(t)q \times \sin\omega) + j \times \\ &\quad (x(t)i \times \sin\omega + x(t)q \times \cos\omega)\end{aligned}$$

$$x3(t)i = x(t)i \times \cos\omega - x(t)q \times \sin\omega$$

$$x3(t)q = x(t)i \times \sin\omega + x(t)q \times \cos\omega$$

As the results of the calculations, the phase correcting unit 505 generates an I signal x3(*t*)i and Q signal x3(*t*)q of the reference baseband signal x3(*t*) having a phase corrected using the phase correction value ω.

The phase correction value ω is the value generated on the basis of the phase components h(p)θ of the distortion compensation coefficients stored in the look-up table (LUT) 601 as described above. Thus, the phase correcting unit 505 can generate, as the reference baseband signal x3(*t*), a signal in which the effect (such as the shift of the phase of the transmission baseband signal after the distortion compensation process from the phase of the transmission baseband signal before the distortion compensation process) on the phase component, which is caused by the distortion compensation process, is appropriately reflected.

2. Second Embodiment

Figure 10:
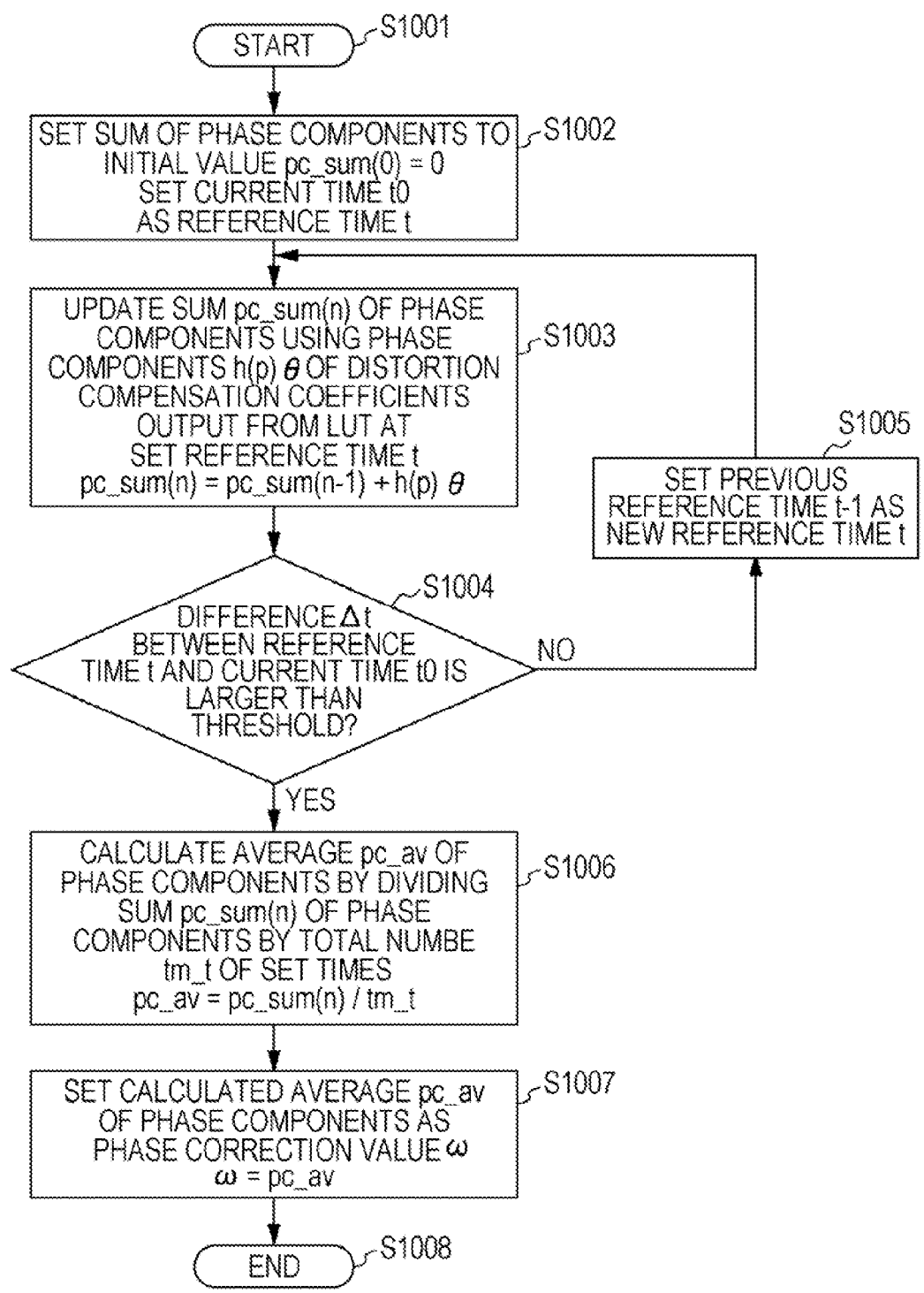
FIG. 10 is a flowchart of an example of a process of calculating a phase correction value according to a second embodiment.

FIG. 10 is a flowchart of a process of calculating the phase correction value ω according to a second embodiment. The process of calculating the phase correction value ω according to the second embodiment is performed by the phase calculating unit. The process of calculating the phase correction value ω according to the second embodiment is different from the process of calculating the phase correction value ω according to the first embodiment. Other parts of a wireless apparatus according to the second embodiment are the same as the other parts of the wireless compensation device 400 according to the first embodiment, while other parts of a distortion compensation device according to the second embodiment are the same as the other parts of the distortion compensation device 409 according to the first embodiment.

The calculation process illustrated in FIG. 10 is described below. The calculation process illustrated in FIG. 10 is performed to calculate the phase correction value ω by calculating the average of phase components h(p)θ of distortion compensation coefficients h(p) that are among the distortion compensation coefficients h(p) stored in the look-up table (LUT) 601 and have been referenced for a time period from a current time to a time that precedes the current time by a certain time period.

In step S1001, the phase calculating unit 506 starts the process of calculating the phase correction value ω.

In step S1002, the phase calculating unit 506 sets the sum pc_sum(n) of phase components to "0" (initial value) (pc_sum(0)=0). In this case, the sum pc_sum(n) of the phase components is a value that indicates the sum of the phase components h(p)θ of the distortion compensation coefficients h(p) that have been output from the look-up table (LUT) 601 to the distortion compensation processing unit 501 for a certain time period. In addition, the phase calculating unit 506 sets a current time t0 as a reference time t(t–t0).

In step S1003, the phase calculating unit 506 acquires the phase components h(p)θ of the distortion compensation coefficients h(p) output from the look-up table (LUT) 601 at the set reference time t.

The look-up table (LUT) 601 may store, for each of the distortion compensation coefficients h(p), information that indicates the reference time t at which the distortion compensation coefficients h(p) are output to the distortion compensation processing unit 501, for example. When the look-up table (LUT) 601 outputs the distortion compensation coefficients h(p) to the distortion compensation processing unit 501, the phase calculating unit 506 may receive the distortion compensation coefficients h(p) from the look-up table (LUT) 601, for example.

The phase calculating unit 506 updates the sum pc_sum(n) of the phase components by adding the acquired phase components h(p)θ to the current sum pc_sum (n−1) (the initial value is "0") of the phase components as indicated by the following equation.

$pc\_sum(n)=pc\_sum(n-1)+h(p)\theta$

In step S1004, the phase calculating unit 506 checks whether or not the difference Δt (=|t−t0|) between the set reference time t and the current time t0 is larger than a threshold Tth. The threshold Tth is a parameter that is used to set a time period for calculating the average of the phase components h(p)θ. The threshold Tth may be changed as appropriate. If the difference Δt is larger than the threshold Tth, the phase calculating unit 506 causes the calculation process to proceed to step S1006. On the other hand, if the difference Δt is not larger than the threshold Tth, the phase calculating unit 506 causes the calculation process to proceed to step S1005.

In step S1005, the phase calculating unit 506 sets a previous reference time t−1 as a new reference time t. After that, the phase calculating unit 506 causes the calculation process to return to step S1003. The phase calculating unit 506 performs the processes of steps S1003 and S1004 on the basis of the reference time t set in step S1005.

In step S1006, the phase calculating unit 506 calculates the average pc_av of the phase components of the distortion compensation coefficients h(p) by dividing the calculated sum pc_sum(n) of the phase components by the total number tm_t of set times as indicated by the following equation.

$pc\_av=pc\_sum(n)/tm\_t$

In step S1007, the phase calculating unit 506 sets the calculated average pc_av of the phase components as the phase correction value ω. In step S1008, the phase calculating unit 506 terminates the process of calculating the phase correction value ω.

In the calculation process illustrated in FIG. 10, the phase calculating unit 506 does not use all the distortion compensation coefficients h(p) stored in the look-up table (LUT) 601 in order to calculate the aforementioned average. In the calculation process illustrated in FIG. 10, the phase calculating unit 506 calculates the average of the phase components h(p)θ only using the distortion compensation coefficients h(p) that have been output from the look-up table (LUT) 601 for the time period from the current time to the time preceding the current time by the certain time period. Thus, it is possible to prevent the size (number of adders) of a circuit for performing the addition process in the phase calculating unit 506 from being large and suppress the circuit size of an arithmetic processing section included in the phase calculating unit 506 to a small size.

The calculation process illustrated in FIG. 10 can be performed every time the distortion compensation device 409 receives a new transmission baseband signal x(t), for example. However, the calculation process illustrated in FIG. 10 is not limited to this. The calculation process illustrated in FIG. 10 may be performed every time the distortion compensation device 409 receives a predetermined number of transmission baseband signals x(t). In addition, the calculation process illustrated in FIG. 10 may be performed at predetermined time intervals.

3. Third Embodiment

Figure 11:
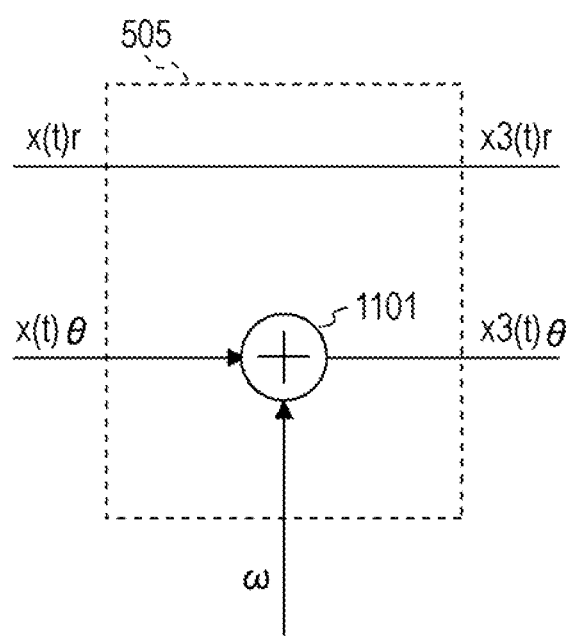
FIG. 11 is a diagram illustrating an example of the configuration of a phase correcting unit according to a third embodiment.

FIG. 11 is a diagram illustrating an example of the configuration of a phase correcting unit 505 according to a third embodiment. The internal configuration of the phase correcting unit 505 according to the third embodiment is different from the internal configuration of the phase correcting unit 505 according to the first embodiment. Other parts of a wireless apparatus according to the third embodiment are the same as the other parts of the wireless compensation device 400 according to the first embodiment, while other parts of a distortion compensation device according to the third embodiment are the same as the other parts of the distortion compensation device 409 according to the first embodiment.

The phase correcting unit 505 illustrated in FIG. 11 performs a process of correcting the phase of a transmission baseband signal x(t) represented in a polar coordinate system. The phase correcting unit 505 includes an adder 1101. The phase correcting unit 505 receives the transmission baseband signal x(t) before the distortion compensation process and receives the phase correction value ω from the phase calculating unit 506.

The adder 1101 performs the following calculations (complex calculations) on an amplitude component signal x(t)r and phase component signal x(t)θ of the transmission baseband signal x(t) before the distortion compensation process on the basis of the received phase correction value ω.

$x3(t)r=x(t)r$ $x3(t)\theta=x(t)\theta+\omega$

As the results of the calculations, the phase correcting unit 505 generates a reference baseband signal x3(*t*)r and a reference baseband signal x3(*t*)θ having a phase corrected using the phase correction value ω.

In this case, the phase correction value ω is the value generated on the basis of the phase components h(p)θ of the distortion compensation coefficients stored in the look-up table (LUT) 601 as described above. Thus, the phase correcting unit 505 can generate, as the reference baseband signal x3(*t*), a signal in which the effect (such as the shift of the phase of the transmission baseband signal after the distortion compensation process from the phase of the transmission baseband signal before the distortion compensation process) on the phase component, which is caused by the distortion compensation process, is appropriately reflected.

4. Fourth Embodiment

FIG. 12 is a diagram illustrating an example of the configuration of a wireless base station 1200 according to a fourth embodiment. As illustrated in FIG. 12, the wireless base station 1200 includes radio equipment (RE) 1201 and radio equipment control (REC) 1202.

The REC 1202 generates a predetermined transmission baseband signal. The RE 1201 receives the generated transmission baseband signal through an interface (I/F) 1203 from the REC 1202. The REC 1202 is connected to the I/F 1203 of the RE 1201 through an optical fiber cable. A signal is transmitted and received between the REC 1202 and the I/F 1203 of the RE 1201 according to a communication protocol called a Common Public Radio Interface (CPRI) protocol. The I/F 1203 has a function of controlling communication that is performed according to the CPRI protocol.

A digital signal processing circuit 1204 receives the transmission baseband signal from the I/F 1203. The digital signal processing circuit 1204 corresponds to the distortion compensation device 409 (illustrated in FIG. 4) and the S/P converter 402 (illustrated in FIG. 4). The digital signal processing circuit 1204 is an FPGA, a DSP or an ASIC, for example. The digital signal processing circuit 1204 includes the distortion compensation device 409 according to any of the first to third embodiments and performs the distortion compensation process and the RF correction process on the received transmission baseband signal. The distortion compensation process and the RF correction process are described in the first to third embodiments. The digital signal processing circuit 1204 can perform the RF correction process on the transmission baseband signal with high accuracy.

An MPU 1213 controls and monitors various operations that are performed by the digital signal processing circuit 1204. Especially, the MPU 1213 controls and monitors the distortion compensation process and the RF correction process.

A D/A converter 1205 corresponds to the D/A converter 403 (illustrated in FIG. 4), while an A/D converter 1212 corresponds to the A/D converter 413 (illustrated in FIG. 4). An upconverter 1206 corresponds to the quadrature modulator 404 (illustrated in FIG. 4) and the frequency converter 405 (illustrated in FIG. 4). A downconverter 1210 corresponds to the quadrature detector 412 (illustrated in FIG. 4) and the frequency converter 411 (illustrated in FIG. 4). A transmission power amplifier 1207 corresponds to the transmission power amplifier 406 (illustrated in FIG. 4). A directional coupler 1208 corresponds to the directional coupler 410 (illustrated in FIG. 4). An antenna 1209 corresponds to the antenna 407 (illustrated in FIG. 4). The downconverter 1210 and the A/D converter 1212 function as a feedback circuit that feeds a signal output from the transmission power amplifier 1207 back to the digital signal processing circuit 1204.

In the distortion compensation device according to each of the above embodiments, an effect of the distortion compensation process that is performed by a distortion compensation processing unit can be appropriately reflected in a reference signal received by a correction processing unit, and whereby the accuracy of the correction process that is performed on the transmission signal after the distortion compensation process by the correction processing unit can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation device for receiving a transmission signal and subjecting the received transmission signal to a distortion compensation process for compensating for a nonlinear distortion caused by a transmission power amplifier, the distortion compensation device comprising:
    a distortion compensation coefficient storage unit configured to store a plurality of distortion compensation coefficients associated with power values of the transmission signals;
    a distortion compensation processing unit configured to acquire a distortion compensation coefficient corresponding to a power value of the received transmission signal from among the plurality of distortion compensation coefficients and to subject the received transmission signal to the distortion compensation process on the basis of the acquired distortion compensation coefficient;
    a phase calculating unit configured to calculate a phase correction value on the basis of the distortion compensation coefficients stored in the distortion compensation coefficient storage unit;
    a phase correcting unit configured to generate a reference signal by correcting a phase of the received transmission signal on the basis of the phase correction value; and
    a correction processing unit configured to perform a correction process for the transmission signal subjected to the distortion compensation process on the basis of the reference signal and a feedback signal, the feedback signal being fed back from the transmission power amplifier.

2. The distortion compensation device according to claim 1,
    wherein the correction process is a process for correcting a quadrature deviation between an in-phase component signal of the transmission signal and a quadrature component signal of the transmission signal.

3. The distortion compensation device according to claim 1,
    wherein the phase calculating unit is configured to calculate an average of phase components of all of the plurality of distortion compensation coefficients and to output the average as the phase correction value.

4. The distortion compensation device according to claim 1,
wherein the phase calculating unit is configured to calculate an average of phase components of distortion compensation coefficients acquired by the distortion compensation processing unit during a time period from a reception time when the transmission signal is received to a time preceding the reception time by a predetermined time interval and to output the average as the phase correction value.

5. The distortion compensation device according to claim 1,
wherein the phase correcting unit is configured to perform a process for adding the phase correction value to a phase component of the transmission signal not subjected to the distortion compensation process.

6. A distortion compensation method in which a transmission signal is received and subjected to a distortion compensation process for compensating for a nonlinear distortion caused by a transmission power amplifier, the distortion compensation method comprising:
storing a plurality of distortion compensation coefficients associated with power values of the transmission signals in a distortion compensation coefficient storage unit;
acquiring a distortion compensation coefficient corresponding to a power value of the received transmission signal from among the plurality of distortion compensation coefficients;
subjecting, by a distortion compensation processing unit, the received transmission signal to the distortion compensation process on the basis of the acquired distortion compensation coefficient;
calculating a phase correction value on the basis of the distortion compensation coefficients stored in the distortion compensation coefficient storage unit;
correcting a phase of the received transmission signal on the basis of the phase correction value to generate a reference signal; and
performing, by a correction processing unit, a correction process for the transmission signal subjected to the distortion compensation process on the basis of the reference signal and a feedback signal, the feedback signal being fed back from the transmission power amplifier.

7. The distortion compensation method according to claim 6,
wherein the correction process is a process for correcting a quadrature deviation between an in-phase component signal of the transmission signal and a quadrature component signal of the transmission signal.

8. The distortion compensation method according to claim 6,
wherein the calculating the phase correction value includes calculating, as the phase correction value, an average of phase components of all of the plurality of distortion compensation coefficients.

9. The distortion compensation method according to claim 6,
wherein the calculating the phase correction value includes calculating, as the phase correction value, an average of phase components of distortion compensation coefficients acquired by the distortion compensation processing unit during a time period from a reception time when the transmission signal is received to a time preceding the reception time by a predetermined time interval.

10. The distortion compensation method according to claim 6,
wherein the correcting the phase includes performing a process for adding the phase correction value to a phase component of the transmission signal not subjected to the distortion compensation process.

11. A wireless apparatus comprising:
a distortion compensation device configured to receive a transmission signal and to subject the received transmission signal to a distortion compensation process;
a quadrature modulator configured to perform a quadrature modulation process for an output signal from the distortion compensation device;
a first frequency converter configured to convert a frequency of an output signal from the quadrature modulator to a radio frequency;
a transmission power amplifier configured to amplify power of an output signal from the first frequency converter, the distortion compensation process being a process for compensating for a nonlinear distortion caused by a transmission power amplifier; and
a feedback circuit configured to generate a feedback signal on the basis of an output signal from the transmission power amplifier and to provide the feedback signal for the distortion compensation device,
wherein the distortion compensation device includes:
a distortion compensation coefficient storage unit configured to store a plurality of distortion compensation coefficients associated with power values of the transmission signals;
a distortion compensation processing unit configured to acquire a distortion compensation coefficient corresponding to a power value of the received transmission signal from among the plurality of distortion compensation coefficients and to subject the received transmission signal to the distortion compensation process on the basis of the acquired distortion compensation coefficient;
a phase calculating unit configured to calculate a phase correction value on the basis of the distortion compensation coefficients stored in the distortion compensation coefficient storage unit;
a phase correcting unit configured to generate a reference signal by correcting a phase of the received transmission signal on the basis of the phase correction value; and
a correction processing unit configured to perform a correction process for the transmission signal subjected to the distortion compensation process on the basis of the reference signal and the feedback signal.

12. The wireless apparatus according to claim 11,
wherein the feedback circuit further includes:
a second frequency converter configured to convert a frequency of the output signal from the transmission power amplifier to a baseband frequency; and
a quadrature detector configured to perform a quadrature detection process for an output signal from the second frequency converter.

13. The wireless apparatus according to claim 11,
wherein the correction process is a process for correcting a quadrature deviation between an in-phase component signal of the transmission signal and a quadrature component signal of the transmission signal.

14. The distortion compensation device according to claim 11,
wherein the phase calculating unit is configured to calculate an average of phase components of all of the plurality of distortion compensation coefficients and to output the average as the phase correction value.

15. The distortion compensation device according to claim 11,
wherein the phase calculating unit is configured to calculate an average of phase components of distortion compensation coefficients acquired by the distortion compensation processing unit during a time period from a reception time when the transmission signal is received to a time preceding the reception time by a predetermined time interval and to output the average as the phase correction value.

16. The distortion compensation device according to claim 11,
wherein the phase correcting unit is configured to perform a process for adding the phase correction value to a phase component of the transmission signal not subjected to the distortion compensation process.

* * * * *